(12) United States Patent
Pereira

(10) Patent No.: US 7,325,091 B2
(45) Date of Patent: Jan. 29, 2008

(54) DISABLING DEFECTIVE BLOCKS IN A PARTITIONED CAM DEVICE

(75) Inventor: Jose Pio Pereira, Santa Clara, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 10/855,580

(22) Filed: May 26, 2004

(65) Prior Publication Data

US 2004/0218453 A1    Nov. 4, 2004

Related U.S. Application Data

(63) Continuation of application No. 09/590,428, filed on Jun. 8, 2000, now Pat. No. 6,763,425.

(51) Int. Cl.
*G06F 12/00*   (2006.01)
*G06F 13/00*   (2006.01)

(52) U.S. Cl. .................. 711/108; 711/100; 711/154; 365/49

(58) Field of Classification Search ................ 711/108, 711/100, 154; 365/49–50
See application file for complete search history.

(56) References Cited

U.S. PATENT DOCUMENTS

| | | | | |
|---|---|---|---|---|
| 4,785,398 A * | 11/1988 | Joyce et al. | .................. | 711/3 |
| 5,359,720 A * | 10/1994 | Tamura et al. | .............. | 711/108 |
| 5,524,231 A * | 6/1996 | Brown | ........................ | 711/101 |
| 6,240,485 B1 * | 5/2001 | Srinivasan et al. | ......... | 711/108 |
| 6,324,087 B1 | 11/2001 | Periera | ........................ | 365/49 |
| 6,615,310 B1 * | 9/2003 | Ridings | ...................... | 711/108 |
| 6,657,878 B2 * | 12/2003 | Lien et al. | ..................... | 365/49 |
| 6,671,771 B2 * | 12/2003 | Perloff | ........................ | 711/108 |
| 6,831,850 B2 * | 12/2004 | Pereira et al. | ................ | 365/49 |
| 2002/0075714 A1 * | 6/2002 | Pereira et al. | ................ | 365/49 |

\* cited by examiner

*Primary Examiner*—Tuan V. Thai
(74) *Attorney, Agent, or Firm*—William L. Paradice, III

(57) ABSTRACT

A CAM device having a plurality of CAM blocks includes circuitry to disable one or more defective CAM blocks, and to selectively translate address space in the disabled CAM blocks to the remaining enabled CAM blocks. In one embodiment, each CAM block is coupled to a corresponding block select circuit and to an address translation circuit. Each block select circuit provides a select signal to a corresponding CAM block to selectively enable or disable the CAM block. The address translation circuit includes logic that translates address space from disabled (e.g., defective) CAM blocks to enabled (e.g., non-defective) CAM blocks. During read and write operations, an address to access a row in a first of the CAM blocks is received into the address translation logic. If the first CAM block is disabled, the address translation logic translates the address to access a row in a second of the CAM blocks. Conversely, if the first CAM block is enabled, the address translation logic facilitates access to the row in the first CAM block.

14 Claims, 11 Drawing Sheets

DISABLING DEFECTIVE BLOCKS IN A PARTITIONED CAM DEVICE

CROSS-REFERENCE TO RELATED APPLICATION

This application is a continuation, and claims the benefit under 35 USC §120, of and commonly owned U.S. patent application Ser. No. 09/590,428 entitled "Method and Apparatus for Address Translation in a Partitioned Content Addressable Memory Device" filed on Jun. 8, 2000, now U.S. Pat. No. 6,763,425 incorporated herein by reference.

BACKGROUND

This invention relates generally to semiconductor memories and specifically to content addressable memories.

DESCRIPTION OF RELATED ART

Content addressable memories (CAMs) are frequently used for address look-up functions in Internet data routing. For example, routers used by local Internet Service Providers (ISPs) typically include one or more CAMs for storing a plurality of Internet addresses and associated data such as, for instance, corresponding address routing information. When data is routed to a destination address, the destination address is compared with all CAM words, e.g., Internet addresses, stored in the CAM array. If there is a match, routing information corresponding to the matching CAM word is output and thereafter used to route the data.

A CAM device includes a CAM array having a plurality of memory cells arranged in an array of rows and columns. Each memory cell stores a single bit of digital information, i.e., either logic zero or logic one. The bits stored within a row of memory cells constitute a CAM word. During compare operations, a comparand word is received at appropriate input terminals of a CAM device and driven into the CAM array using comparand lines to be compared with all the CAM words in the device. For each CAM word that matches the comparand word, a corresponding match line signal is asserted to indicate a match condition. If the comparand word matches more than one of the CAM words, the match line corresponding to each of the matching CAM words is asserted, and a "multiple match" flag is also asserted to indicate the multiple match condition. The match line signals from each CAM block are combined in a priority encoder to determine the index or address of the highest-priority matching CAM word. Associative information corresponding to the highest-priority matching CAM word stored in, for instance, an associated RAM, may also be provided.

A single CAM device may include one or more CAM blocks, each having an array of CAM cells. In such a device, the CAM blocks typically have consecutive address spaces. When one of the CAM blocks is defective, the corresponding address space is no longer available. As a result, the entire CAM device may no longer be suitable for its intended purpose, particularly when the address spaces in the remaining, non-defective CAM blocks are non-contiguous. Rather than discarding the CAM device, it would be desirable to disable the one or more defective CAM blocks, and operate the remaining non-defective CAM blocks using contiguous address space.

SUMMARY

A method and apparatus are disclosed that may be used to disable one or more defective CAM blocks, and to selectively translate address space in the disabled CAM blocks to the remaining enabled CAM blocks. In accordance with one embodiment of the present invention, each CAM block is coupled to a corresponding block select circuit and to an address translation circuit. Each block select circuit provides a select signal to a corresponding CAM block to selectively enable or disable the CAM block. The address translation circuit includes logic that translates address space from disabled (e.g., defective) CAM blocks to enabled (e.g., non-defective) CAM blocks. During read and write operations, an address to access a row in a first of the CAM blocks is received into the address translation logic. If the first CAM block is disabled, the address translation logic translates the address to access a row in a second of the CAM blocks. Conversely, if the first CAM block is enabled, the address translation logic facilitates access to the row in the first CAM block.

In one embodiment, the address translation logic includes decode logic providing a number of decode signals, a plurality of multiplexers each having a number of inputs to receive the number of decode signals and an output to provide a block select signal to a corresponding CAM block, and a plurality of memory elements for storing multiplexer select values for the corresponding plurality of multiplexers. During read and write operations, one or more block address bits from the address are decoded by the decode logic to assert one of the decode signals. The multiplexers, which control which CAM block is selected for the operation in response to the asserted decode signal, may be programmed to selectively translate an address accessing a row in a first CAM block to access a row in a second CAM block by manipulating the multiplexer select values stored in the memory elements.

BRIEF DESCRIPTION OF THE DRAWINGS

Like reference numerals refer to corresponding parts throughout the drawing figures.

DETAILED DESCRIPTION

Embodiments of the present invention are discussed below in the context of a CAM device 100 for simplicity only. It is to be understood that embodiments of the present invention are equally applicable to CAM structures having other configurations of any suitable type of CAM cells. Further, architectural configurations of the present invention may be implemented in other types of memory blocks such as, for instance, RAM, Flash, and EEPROM. The interconnection between circuit elements or blocks may be shown as buses or as single signal lines, where each of the buses may alternatively be a single signal line, and each of the single signal lines may alternatively be a bus. In addition, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Figure 1:
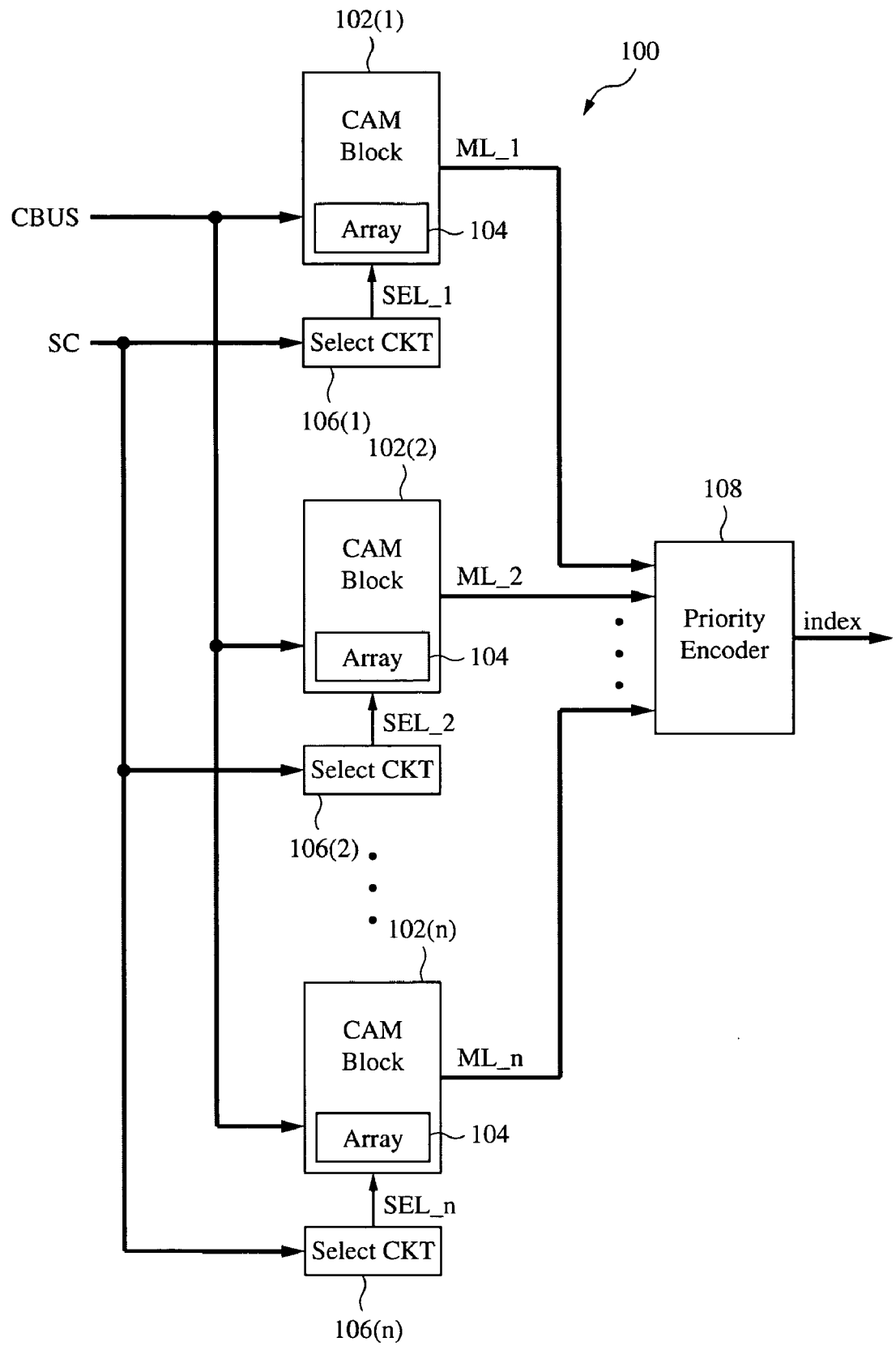
FIG. 1 is a block diagram of a CAM device including a plurality of CAM blocks in accordance with one embodiment of the present invention.

FIG. 1 shows a CAM device 100 in accordance with one embodiment of the present invention as having a number n of CAM blocks 102(1)-102(n), a corresponding number n of block select circuits 106(1)-106(n), and a priority encoder 108. Each CAM block 102 includes a CAM array 104 having a plurality of rows of CAM cells for storing a plurality of CAM words therein, and is connected to a corresponding block select circuit 106. Each row may also include one or more valid bits indicative of whether a valid CAM word is stored in the row. The valid bits may be used in a well-known manner to generate a full flag for the CAM block 102. CAM blocks 102 may be any suitable type of CAM block, including for example, synchronous, asynchronous, binary, and ternary CAMs. Further, each CAM block 102 may be any suitable size, and in some embodiments may be of different sizes. In one embodiment, each CAM block 102 includes 1k (1024) rows of CAM cells.

During a compare operation, each CAM block 102 receives comparand data from a comparand bus CBUS. Other signals provided to the CAM device 100 during the compare operation may be a clock signal CLK, one or more instructions from an instruction decoder (not shown for simplicity), and other control signals. In some embodiments, instructions and comparand data may be provided to the CAM blocks 102(1)-102(n) via the same bus. Other well-known signals which may be provided to the CAM blocks 102, such as word enable signals, reset signals, and enable signals, are not shown for simplicity.

Each CAM block 102 provides a plurality of match line signals to the priority encoder 108 via corresponding match lines ML. The match lines carry match signals indicative of match conditions in the CAM arrays 104. For simplicity, the plurality of match lines ML from each CAM block 102 are represented collectively in FIG. 1. The priority encoder 108 generates an index corresponding to one of the matching CAM words in the device 100. In one embodiment, the priority encoder 108 outputs the index of the highest priority match. The highest priority match may be the lowest numbered address, the highest numbered address, or any other selected address.

For purposes of discussion herein, the first CAM block 102(1) in the device 100 is designated as the highest priority block, the second CAM block 102(2) is designated as the next highest priority block, and so on, and the last CAM block 102(n) is designated as the lowest priority block, although in actual embodiments priority may be reversed or otherwise modified. Thus, the highest priority CAM block 102(1) may include the lowest CAM addresses (i.e., CAM addresses 0 to k-1), the next highest priority block 102(2) may include the next lowest CAM addresses (i.e., CAM addresses k to 2k-1), and so on, and the lowest priority CAM block 102(n) may include the highest CAM addresses (i.e., CAM addresses (n-1)k to nk-1).

The block select circuits 106(1)-106(n) control whether corresponding CAM blocks 102(1)-102(n), respectively, participate in compare operations. Each block select circuit 106 stores a class code for the corresponding CAM block 102 which may be used to selectively disable the CAM block from participating in, and therefore from affecting the results of, one or more compare operations. During a compare operation, a comparand word is provided to the CAM blocks 102 via CBUS, and a search code is provided to the block select circuits 106(1)-106(n) via bus SC. In alternate embodiments, the search code may be provided as part of the comparand word, in which case the CBUS is connected to the block select circuits 106, or may be provided as part of a compare instruction. Each block select circuit 106 compares the received search code with its stored class code, and in response thereto, selectively disables the corresponding CAM block 102 from participating in the compare operation via a select signal SEL. In one embodiment, the block select circuit 106 enables its corresponding CAM block 102 to participate in the compare operation if the class code matches the search code and, conversely, disables the corresponding CAM block 102 if the class code does not match the search code. In alternate embodiments, more than one CAM block 102 may share the same block select circuit 106.

The class codes assigned to the CAM blocks 102 may be used to partition the device 100 into individually selectable partitions of one or more CAM blocks 102. For example, in one embodiment, data stored in the first CAM block 102(1) may be assigned to a first class by storing a first class code in block select circuit 106(1), data stored in the second CAM block 102(2) may be assigned to a second class by storing a second class code in block select circuit 106(2), and data stored in the remaining CAM blocks 102(3)-102(n) may be assigned to a third class by storing a third class code in block select circuits 106(3)-106(n). Then, for example, data stored in the first CAM block 102(1) may be selected for searching by setting the search code to match the first class code stored in the block select circuit 106(1).

When the search code matches the first class code, the block select circuit 106(1) enables the first CAM block 102(1) to compare the comparand word with its stored data corresponding to the first class code. If the search code does not match the second and third class codes, the remaining block select circuits 106(2)-106(n) disable the corresponding, unselected CAM blocks 102(2)-102(n). When disabled, the unselected CAM blocks 102(2)-102(n) do not drive the comparand word into their respective CAM arrays 104 for the compare operation, thereby precluding comparison with unselected data corresponding to the second and third class codes. In this manner, the CAM blocks 102(1)-102(n) may be selectively searched according to class assignments, thereby allowing for a dynamically partition-able CAM device 100.

Since the comparand word is not compared with data stored in the disabled CAM blocks 102(2)-102(n), the disabled CAM blocks 102(2)-102(n) consume much less power during the compare operation than does the selected, enabled CAM block 102(1). In this manner, the class codes of present embodiments not only restrict compare operations to data in the selected CAM block(s), but also minimize power consumption of the unselected CAM block(s) during compare operations. The advantage of reduced power consumption in unselected CAM blocks during compare operations achieved by present embodiments may be particularly useful in applications where power consumption is a concern.

The ability to selectively enable or disable one or more CAM blocks from participating in compare operations may be especially useful for combining routing look-up functions for different classes of networks in a single device 100. For example, in one embodiment, routing information for a first virtual private network (VPN) may be stored in a first CAM block 102(1), routing information for a second VPN may be stored in a second CAM block 102(2), routing information for a web search may be stored in a third block 102(3), and routing information for a local area network (LAN) may be stored in a fourth CAM block 102 (4). Four unique class codes may be stored in corresponding block select circuits 106. Of course, more than one CAM block may be assigned to a particular network by storing the appropriate class code in more than block select circuit 106. During compare operations, comparand data corresponding to routing functions of one of these four networks may be exclusively compared with data stored in the corresponding CAM block(s) by simply setting the search code to match the appropriate class code. In some embodiments, an associative RAM may be partitioned into four partitions corresponding with the four class-defined partitions in the CAM device 100.

Figure 2:
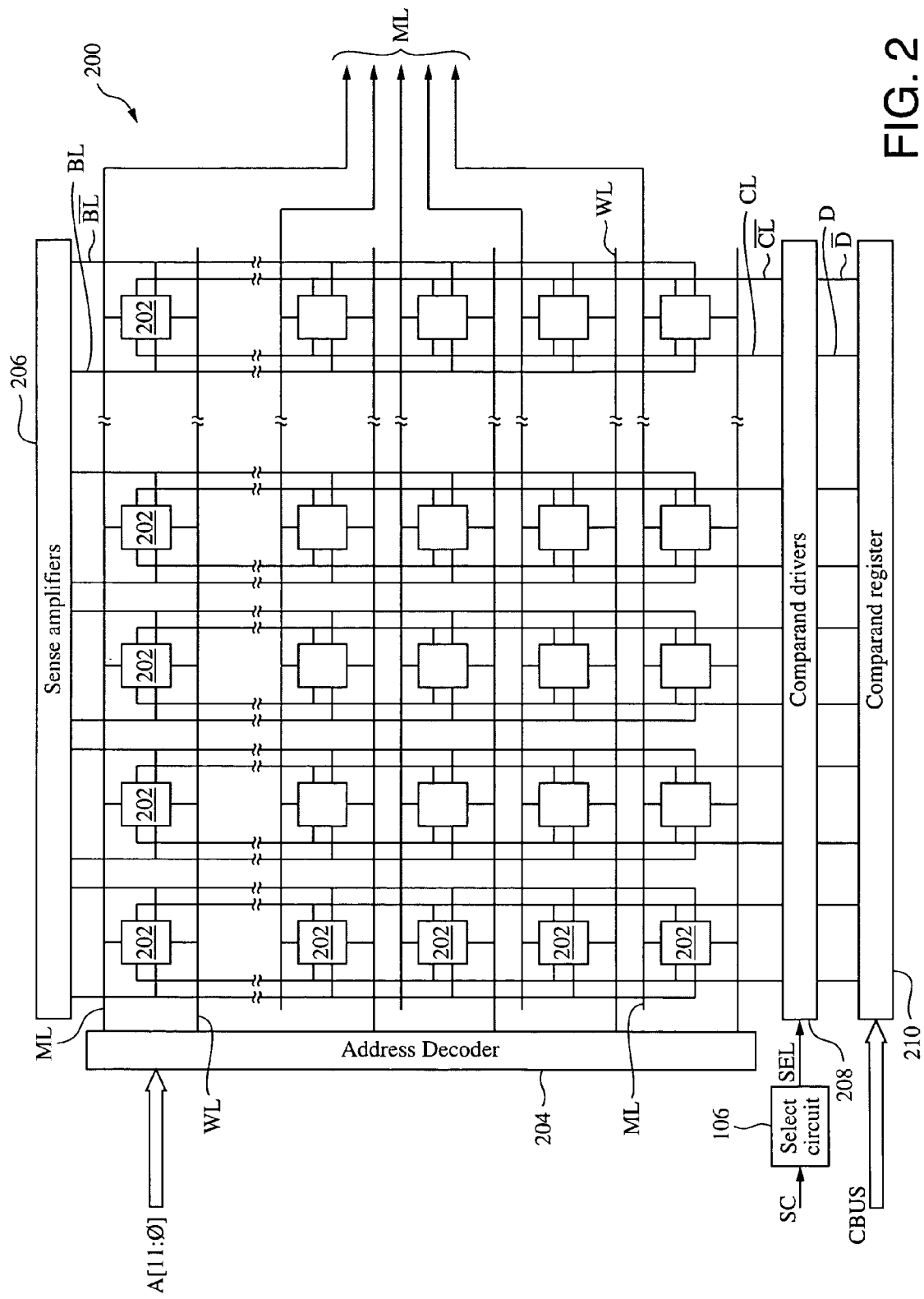
FIG. 2 is a block diagram of a CAM block in one embodiment of the array of FIG. 1.

FIG. 2 shows a CAM array 200 that is one embodiment of a CAM array 104 of FIG. 1. The array 200 includes a plurality of CAM cells 202 organized in any number of rows and columns. Each row of CAM cells 202 is coupled to a match line ML and a word line WL. Each word line WL is driven by an address decoder 204 to select one or more of CAM cells 202 for writing or reading. For alternative embodiments, multiple CAM blocks may share a decoder. Each match line ML provides the match results of a compare operation to the priority encoder 108 (see also FIG. 1). A match line ML indicates a match condition for the row only if all CAM cells 202 in that row match the comparand data. Each CAM cell 202 may be a binary, ternary, SRAM-based or DRAM-based CAM cell. In some embodiments, the match line ML is pre-charged for the compare operation. If any CAM cell 202 in the row does not match the comparand data, the CAM cell(s) 202 discharges the match line ML toward ground potential (e.g., logic low). Conversely, if all CAM cells 202 match the comparand data, the match line ML remains in a charged state (e.g., logic high). When the CAM block 102 is disabled in response to the select signal SEL, the comparand word is not driven into the array 200, and the match lines ML may remain in their charged state during the compare operation, regardless if there is a mismatch. The match lines need not be pre-charged for a subsequent compare operation. The ability to maintain the match lines of unselected CAM blocks in their charged state during the compare operation may further reduce power consumption of present embodiments over prior art architectures.

Each column of CAM cells 202 is coupled to a bit line BL, a complementary bit line $\overline{BL}$, a comparand line CL, and a complementary comparand line $\overline{CL}$. The bit lines BL and $\overline{BL}$ are coupled to sense amplifiers 206 that may enable data to be written to or read from a row of CAM cells 202. The comparand lines CL and $\overline{CL}$ are coupled to comparand drivers 208, which in turn are coupled to a comparand register 210 via complementary data lines D and $\overline{D}$. The comparand drivers 208 selectively drive a comparand word received from the comparand register 210 via complementary data lines D and $\overline{D}$ onto complementary comparand lines CL and $\overline{CL}$ for comparison with data in CAM cells 202 in response the select signal SEL provided by the block select circuit 106. The comparand register 210 may be shared by all CAM blocks 102(1)-102 (n). As discussed above with respect to FIG. 1, the block select circuit 106 generates the select signal SEL in response to the search code and its stored class code.

In alternate embodiments, other CAM array architectures may be used. For example, in some embodiments, CAM array 200 may not include complementary comparand lines CL and $\overline{CL}$, in which case the complementary bit lines BL and $\overline{BL}$ may be coupled to the comparand drivers 208 and be used to perform a compare operation as is generally known in the art. For example, in the first part of a compare cycle, compare data may be selectively driven onto BL and $\overline{BL}$, and during the second part of the compare cycle, BL and $\overline{BL}$ may be driven with data to be output from CAM array 200. For other embodiments, only one of comparand lines CL and $\overline{CL}$ or bit lines BL and $\overline{BL}$ may be needed.

Figure 3:
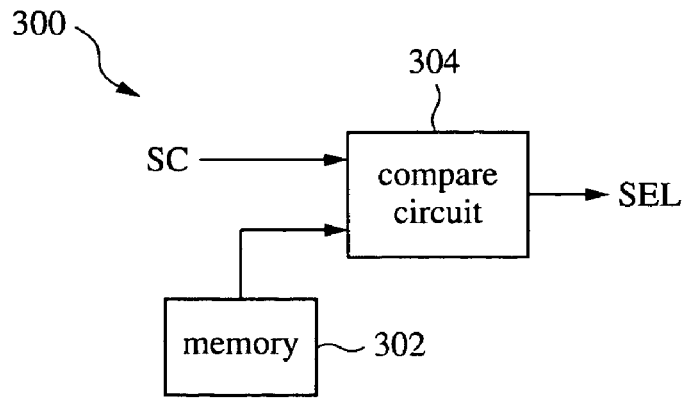
FIG. 3 is a block diagram of a block select circuit in one embodiment of the CAM block of FIG. 2.

FIG. 3 shows a block select circuit 300 that is one embodiment of the block select circuit 106. The block select circuit 300 includes a memory 302 and a compare circuit 304. The memory 302 stores the class code for the corresponding CAM block 102 of device 100, and may be any suitable programmable memory element such as, for instance, a register, flip-flop, EEPROM, EPROM, SRAM, and so on. The compare circuit 304 compares the class code received from the memory 302 with a search code received from bus SC and, in response thereto, generates the select signal SEL which selectively enables or disables the corresponding CAM block 102. The compare circuit 304 may be any suitable circuit which compares the search code and the class code, including for example an exclusive-OR type logic gate or a CAM cell.

Figure 4:
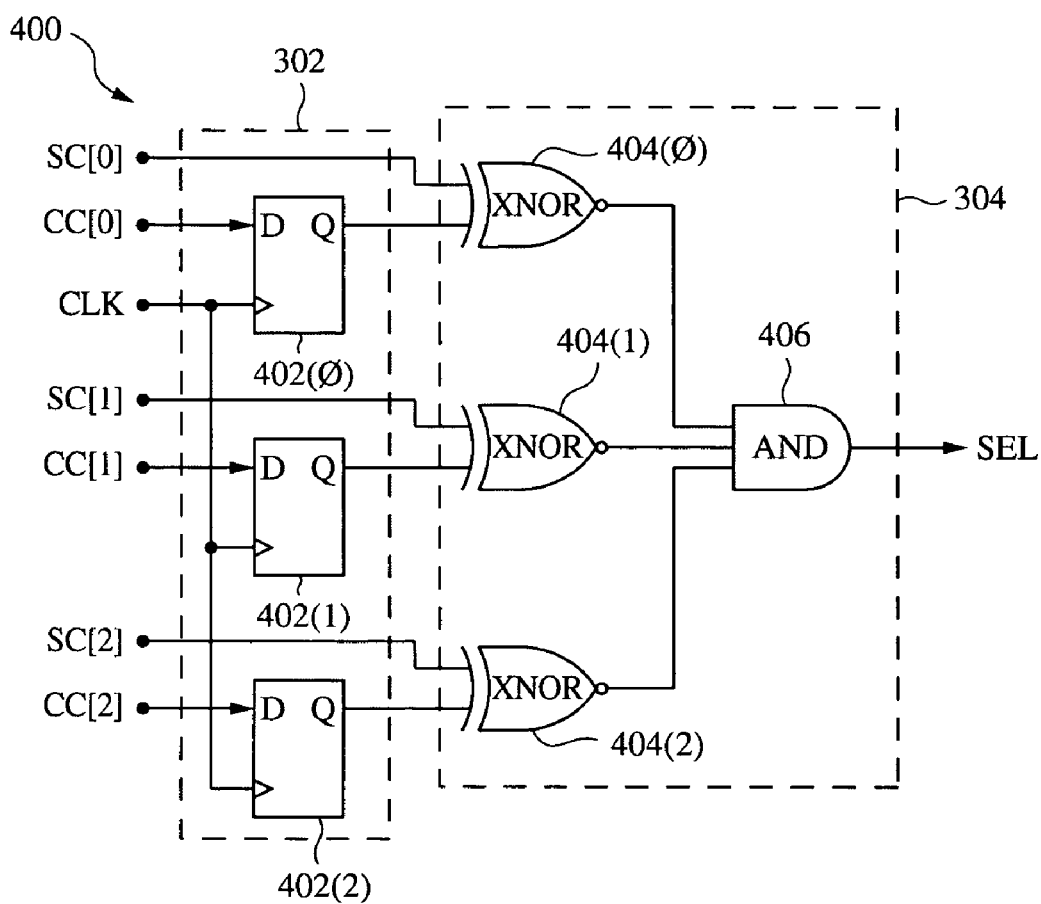
FIG. 4 is a logic diagram of one embodiment of the block select circuit of FIG. 3.

FIG. 4 shows a block select circuit 400 that is one embodiment of the block select circuit 300. The block select circuit 400 is shown to include a 3-bit memory 302 and a 3-bit compare circuit 304, although in other embodiments more or less bits may be used. The memory 302 includes three data flip-flops 402(0)-402(2), and the compare circuit 304 includes three exclusive-NOR (XNOR) gates 404(0)-404(2) and an AND gate 406. Each XNOR gate 404(0)-404(2) includes a first input terminal to receive a corresponding search code bit SC, a second input terminal to receive a corresponding class code bit CC from the corresponding flip-flop 402, and an output terminal connected to the AND gate 406. A 3-bit class code CC[0:2] may be clocked into respective flip-flops 402(0)-402(2) using the clock signal CLK, where flip-flop 402(0) stores the first class code bit CC[0], flip-flop 402(1) stores the second class bit code CC[1], and flip-flop 402(2) stores the third class code bit CC[2].

During compare operations, the XNOR gates 404(0)-404(2) compare search code bits SC[0:2] with respective class code bits CC[0:2] and, if there is match, drive their output terminals to logic high. Conversely, if there is a mismatch, the XNOR gate 404 drives its output terminal to logic low. If all search code bits SC[0:2] match corresponding class code bits CC[0:2], then AND gate 406 asserts the select signal SEL to logic high, thereby enabling the corresponding CAM block 102 to participate in the compare operation. Otherwise, if any of the search code bits SC[0:2] mismatch corresponding class code bits CC[0:2], the AND gate 406 de-asserts the select signal to logic low, thereby disabling the corresponding CAM block 102 from participating in the compare operation. Since class code bits may be loaded into flip-flops 402(0)-402(2) before a compare operation, the gate delay associated with generating the select signal during the compare operation is only 2 gate delays, one for XNOR gates 404 and one for AND gate 406, and therefore has a negligible effect upon device performance.

Figure 5:
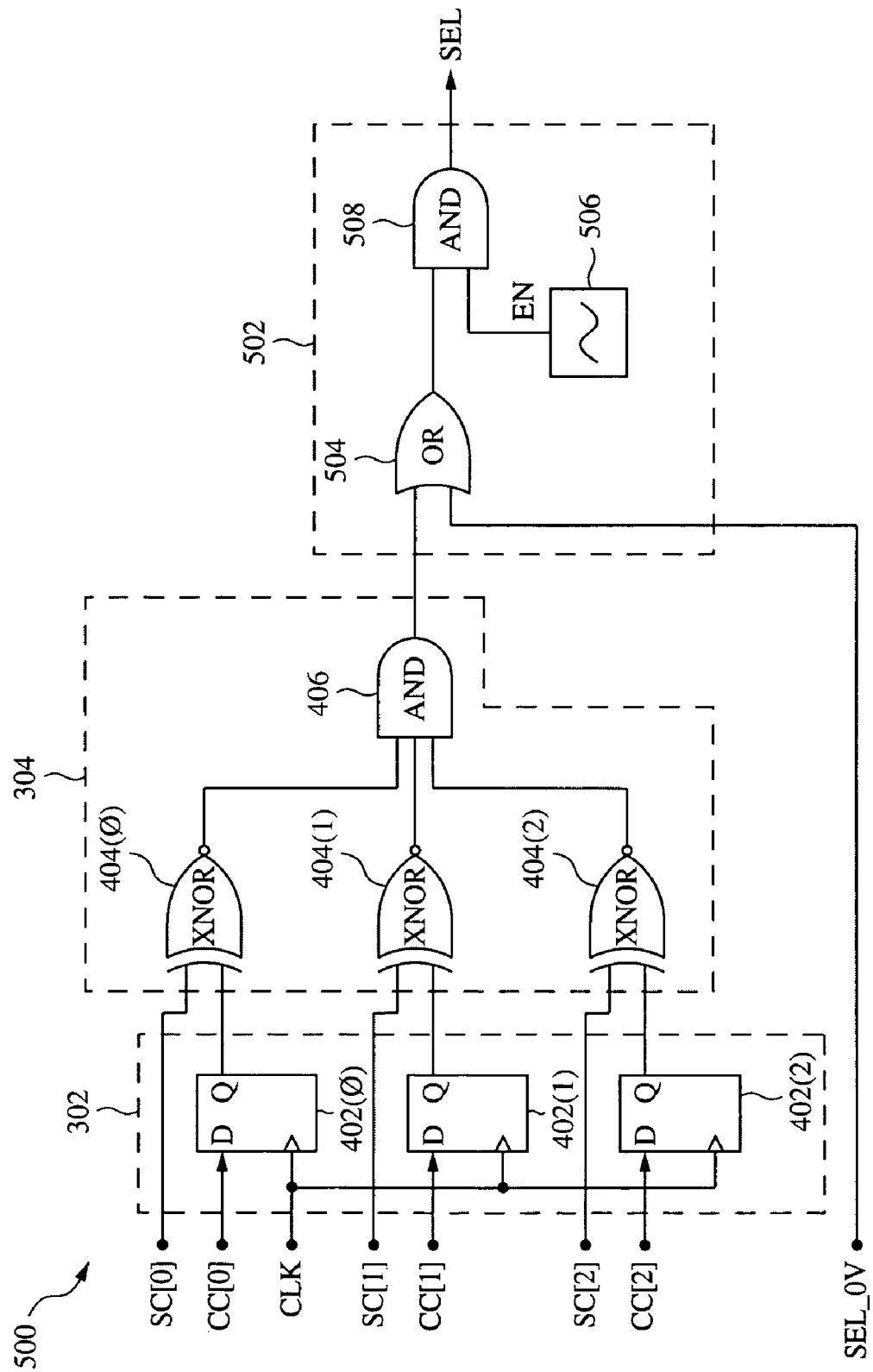
FIG. 5 is a logic diagram of another embodiment of the block select circuit of FIG. 3.

FIG. 5 shows a block select circuit 500 that is another embodiment of the block select circuit 300. Here, a logic circuit 502 is coupled to the output terminal of the AND gate 406 to allow for direct control of the select signal SEL using control signals EN and SEL_OV. The logic circuit 502 includes an OR gate 504 having a first terminal coupled to the output terminal of the AND gate 406, a second terminal to receive EN, and an output terminal coupled to a first input terminal of an AND gate 508. The AND gate 508 includes a second input terminal to receive SEL_OV, and an output terminal to provide the select signal SEL. The signal EN enables the corresponding CAM block 102 to participate in the compare operation when the output of AND gate 406 is logic high. When asserted to logic high, EN enables the corresponding CAM block 102 for the compare operation and, conversely, when de-asserted to logic low, EN disables the corresponding CAM block 102 for the compare operation regardless if there is a match condition. The EN signal may be used to selectively disable CAM blocks 102, for instance, when defective. The signal EN is shown in FIG. 5 as being provided by a fuse 506, although in other embodiments EN may be provided by other means such as a programmable memory element, e.g., a register, flip-flop, EPROM, EEPROM, SRAM, etc. The signal SEL_OV is a select override signal that, when asserted to logic high, may be used to force the select signal SEL to logic high to enable the corresponding CAM block 102 to participate in compare operations, irrespective of whether there is a class match. For an alternative embodiment, the relative locations of OR gate 504 and AND gate 508 may be reversed such that when SEL_OV is set to a logic high state, then SEL will be set to a logic high state irrespective of whether there is a class match or the logic state of EN.

Figure 6:
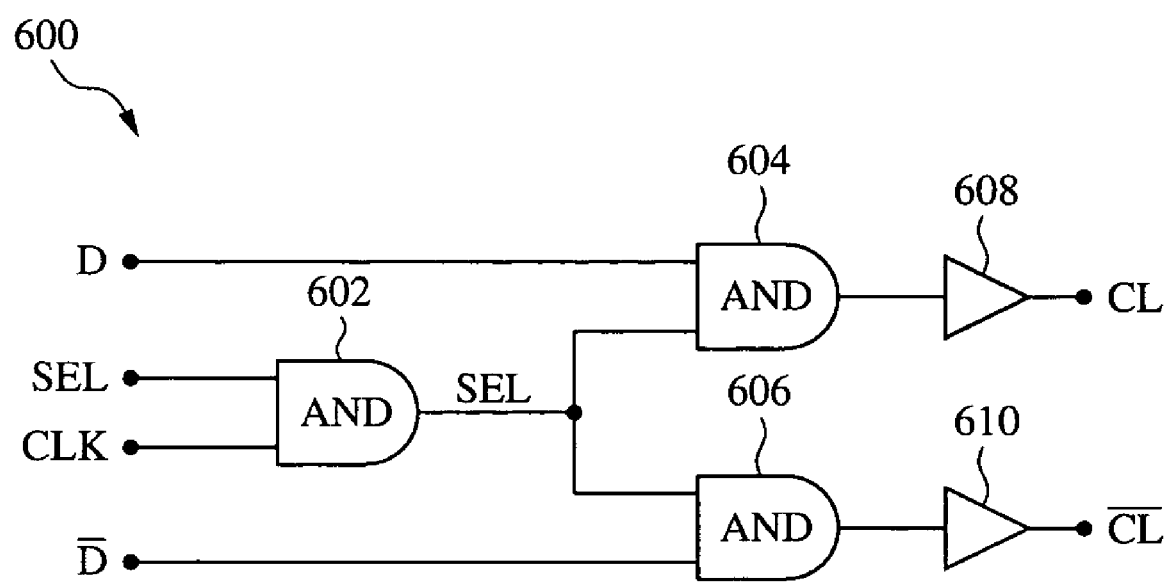
FIG. 6 is a logic diagram of one embodiment of a comparand driver of the CAM block of FIG. 2.

FIG. 6 shows a 1-bit comparand driver 600 that is used in one embodiment of the comparand drivers 208. Driver 600 includes AND gates 602, 604, and 606, and also includes buffers 608 and 610. AND gate 602 includes input terminals to receive the clock signal CLK and the select signal SEL, and an output terminal coupled to first input terminals of AND gates 604 and 606. AND gate 604 includes a second input terminal coupled to the data line D, and an output terminal coupled to the buffer 608, which in turn drives the comparand line CL. AND gate 606 includes a second input terminal coupled to the complementary data line $\overline{D}$, and an output terminal coupled to the buffer 610, which in turn drives the complementary comparand line $\overline{CL}$. Buffers 608 and 610 may be any suitable buffers to drive comparand data onto the comparand lines CL and $\overline{CL}$. A plurality of drivers 600 may share the AND gate 602.

During a compare operation, a comparand bit is provided to AND gate 604 via data line D, and a complementary comparand bit is provided to AND gate 606 via complementary data line $\overline{D}$. When CLK is logic high, the select signal SEL propagates through AND gate 602 to AND gates 604 and 606. If the select signal is asserted to logic high, AND gate 606 passes the comparand bit to the buffer 608, which in turn drives the comparand bit onto the comparand line CL. Similarly, AND gate 608 passes the complementary comparand bit to the buffer 610, which in turn drives the complementary comparand bit onto the complementary comparand line $\overline{CL}$. Thus, when the select signal SEL is asserted, the comparand driver 600 drives the comparand lines CL and $\overline{CL}$ with the comparand data received from the comparand register 210 via data lines D and $\overline{D}$.

Conversely, if the select signal SEL is de-asserted to logic low to indicate that the corresponding CAM block 102 is not to participate in the compare operation, AND gates 606 and 608 force their respective output terminals to logic low. In response thereto, buffers 608 and 610 force the comparand line CL and the complementary comparand line $\overline{CL}$, respectively, to logic low. In this manner, when the select signal SEL is de-asserted, the comparand driver 600 does not drive complementary comparand data onto the comparand lines CL and $\overline{CL}$, thereby precluding the corresponding CAM block 102 from participating in the compare operation while minimizing power consumption in the CAM block.

The present invention is also particularly useful in increasing manufacturing yield of a CAM device by disabling defective CAM blocks in the device. Thus, for instance, during manufacture of a CAM device having n CAM blocks, if one or more of the CAM blocks are found to be defective or otherwise inoperable after manufacturing, rather than discarding the entire device, the defective blocks may be disabled using the block select circuits as described above, and the remaining non-defective CAM blocks may then be used for compare operations. For example, in one embodiment where the CAM device includes 8 CAM blocks each having 1k rows of CAM cells, if one of the CAM blocks is defective, that CAM block is disabled, and the remaining 7 CAM blocks may be used as a 7k CAM device. Accordingly, the ability to use the CAM device when one or more of its CAM blocks are defective advantageously increases manufacturing yield of the CAM device.

Figure 7:
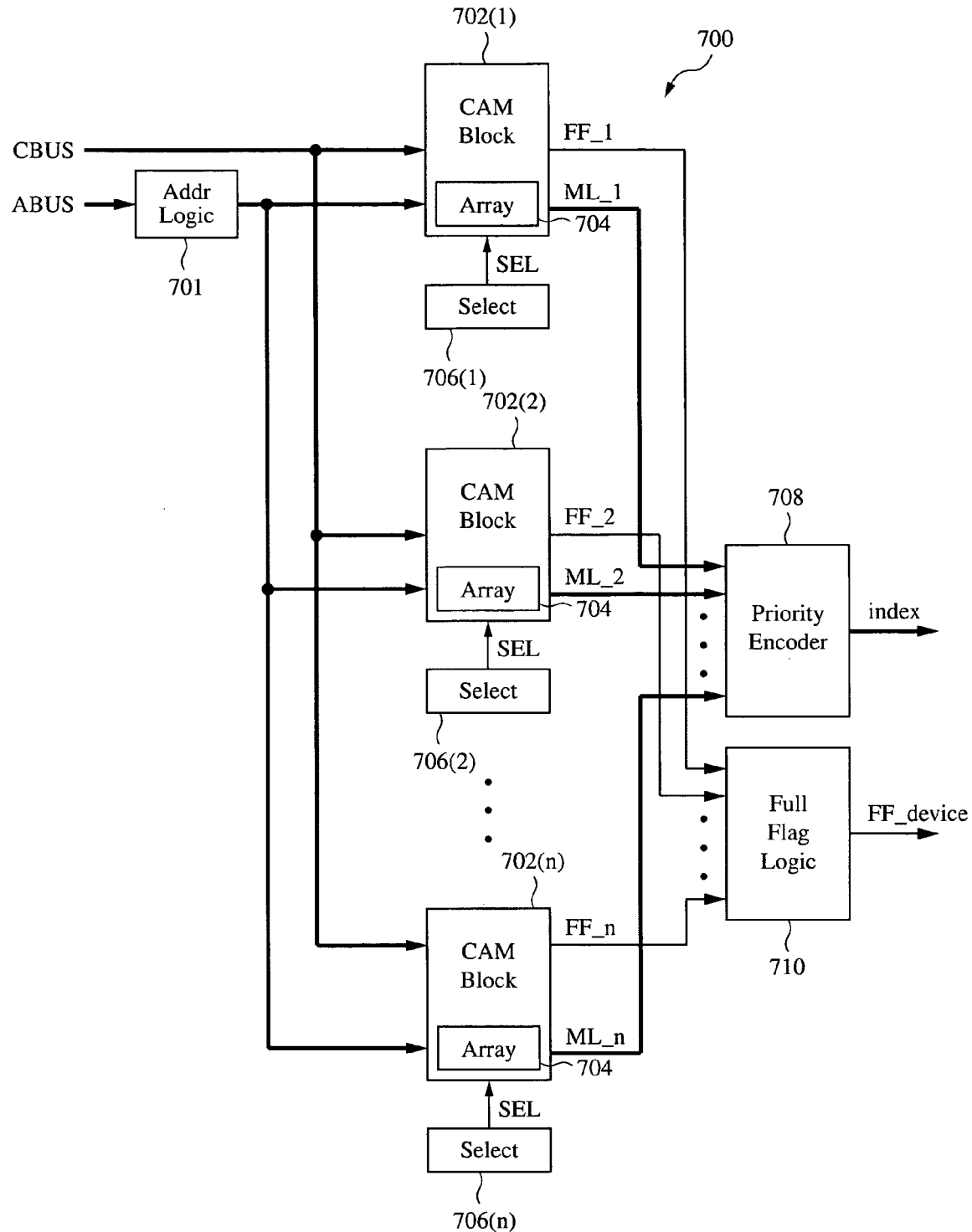
FIG. 7 is a block diagram of a CAM device including a plurality of CAM blocks in accordance with another embodiment of the present invention configured to translate addresses of one or more defective CAM blocks.

FIG. 7 shows a CAM device 700 that is a modified embodiment of the device 100 of FIG. 1 which allows for one or more defective CAM blocks to be disabled for CAM operations, and also includes circuitry which translates or re-assigns address locations in defective CAM blocks to address locations in non-defective CAM blocks. The device 700 includes address logic 701, a plurality of CAM blocks 702(1)-702(n), a plurality of block select circuits 706(1)-706(n) corresponding to CAM blocks 702(1)-702(n), respectively, a priority encoder 708, and full flag logic 710. Each of the block select circuits 706(1)-706(n) provides to the corresponding CAM block 702 a select signal which may be used as described above to disable the CAM block 702 if, for example, the CAM block 702 is defective.

The block select circuit 706 may be any suitable circuit to provide either a logic high (enabling) or a logic low (disabling) select signal SEL to the corresponding CAM block 702. In some embodiments, the block select circuit 706 includes a memory (not shown in FIG. 7) for storing a binary value indicative of SEL. In some embodiments, the block select circuit 706 provides a logic high SEL signal if the corresponding CAM block 702 is not defective, and provides a logic low SEL signal if the corresponding CAM block 702 is defective. In one embodiment, the block select circuit 706 may include the block select circuit 500 (FIG. 5), in which case the signal EN may be set to a low logic state by blowing fuse 506 to disable a defective CAM block 702 via signal SEL. In other embodiments, the block select circuit 706 may be a fuse (or a memory element) connected between the CAM block 702 and a voltage supply, in which case the fuse may be blown to provide a logic low SEL signal to disable the corresponding CAM block 702.

After fabricating the device 700, each of the CAM blocks 702(1)-702(n) is tested in a suitable manner. For each CAM block 702 that is found to be defective, the corresponding block select circuit 706 is configured to provide a logic low select signal SEL to the CAM block 702 to disable the CAM block. Conversely, for each CAM block 702 that is not defective, the corresponding block select circuit 706 is configured to provide a logic high select signal to the CAM block to enable its participation in CAM operations.

Figure 8:
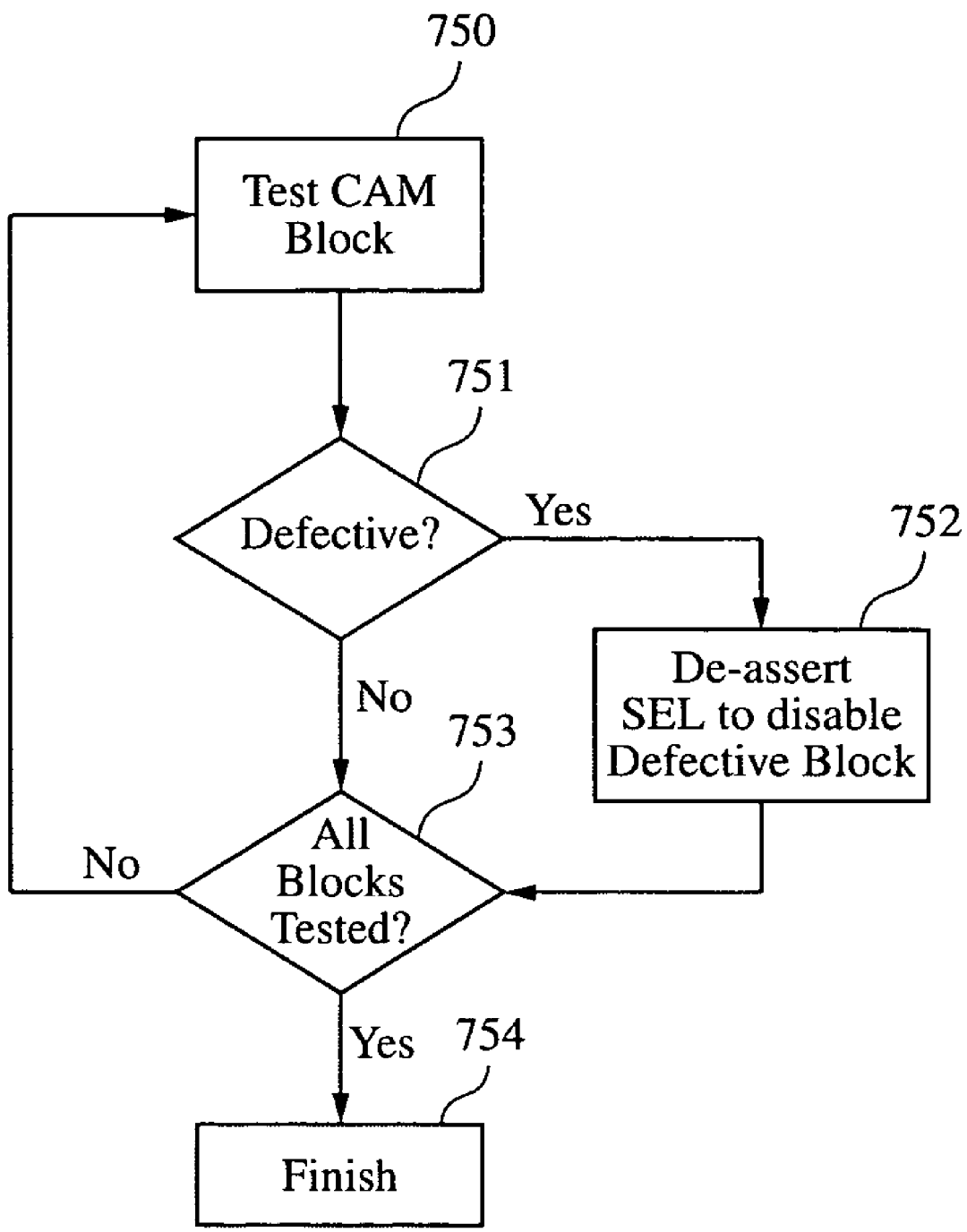
FIG. 8 is a flow chart illustrating the disabling of defective CAM blocks in one embodiment.

Testing the CAM blocks of a CAM device and then selectively disabling the defective CAM blocks in an embodiment using a fuse to provide SEL is illustrated with reference to the flow chart of FIG. 8. Here, a fuse (not shown for simplicity) in each block select circuit 706 is coupled to a voltage supply and thus initially provides an asserted (e.g., logic high) SEL to enable the corresponding CAM block 702. Each CAM block 702 is tested in a suitable manner to determine whether it is defective (step 750). If the CAM block is defective, as tested at step 751, SEL is de-asserted (e.g., to logic low) to disable the defective CAM block by blowing the fuse. Otherwise, if the CAM block is not defective, the corresponding fuse is not blown, and the corresponding CAM block remains enabled. If all CAM blocks have been tested, as determined at step 753, processing is finished (step 754). Otherwise, the next CAM block is tested and thereafter disabled if found to be defective (steps 750-752).

During a compare operation, each CAM block 702 receives comparand data from the comparand bus CBUS in a manner similar to that of CAM blocks 102 of device 100 of FIG. 1. Other signals provided to device 700 during the compare operation may be a clock signal CLK, one or more instructions from an instruction decoder (not shown for simplicity), and other control signals. Each CAM block 702 provides a plurality of match line signals to the priority encoder 708 via corresponding match lines ML. The match lines carry match signals indicative of match conditions in the CAM arrays 704. For simplicity, the plurality of match lines ML from each CAM block 702 are represented collectively in FIG. 7. The priority encoder 708 generates an index corresponding to one of the matching CAM words in the device 700, which as described above may be index of the highest-priority matching CAM row.

Each CAM block 702 provides a full flag signal FF indicative of whether the CAM block is full, i.e., whether there are any available row in the CAM block 702 to store data, to full flag logic 710. The full flag signal FF may be generated for each CAM block 702 in a well-known manner using one or more valid bits in each row of the CAM block. The full flag signals FF_1 to FF_n provided by CAM blocks 702(1)-702(n), respectively, are combined in a well-known manner in full flag logic 710 to generate a device full flag, FF_device, indicative of whether there are any available rows in the device 700. When a CAM block 702 is found to be defective or otherwise inoperable for its intended purpose, the CAM block 702 is configured to maintain an asserted full flag signal FF to indicate that the defective CAM block 702 does not include any available memory locations. In one embodiment, the full flag signal FF for the defective CAM block may be maintained in the asserted state by forcing the valid bits in its array 704 to an asserted state. In other embodiments, a fuse may be provided within or associated with each CAM block 702 that, when blown, forces the corresponding full signal FF to be asserted.

Address logic 701 is shown in FIG. 7 as coupled to an address bus ABUS and each of the CAM blocks 702 (1)-702 (n). During read and write operations, an address provided to the device 700 may be received into address logic 701 via address bus ABUS, and thereafter used to select a row in one of the CAM blocks 702(1)-702(n) for the read or write operation. In accordance with the present invention, if a CAM block 702 to which the address refers is defective, and is thus disabled for the operation using the corresponding block select circuit 706 as describe above, address logic 701 translates the address from the defective or disabled CAM block to a non-defective CAM block. Conversely, if the CAM block 702 to which the address refers is non-defective, and is thus enabled for operation, address logic 701 forwards the address to the appropriate CAM block 702. As explained more fully below, address logic 701 ensures a contiguous addressing scheme in the CAM blocks 702 when one or more CAM blocks 702 are defective and disabled, even when the non-defective CAM block(s) 702 are not adjacent to each other.

For alternate embodiments, address logic 701 may be omitted. For one example, contiguous non-defective blocks starting from block 702(1) may still be used. For other embodiments, any non-defective block may be used.

Figure 9:
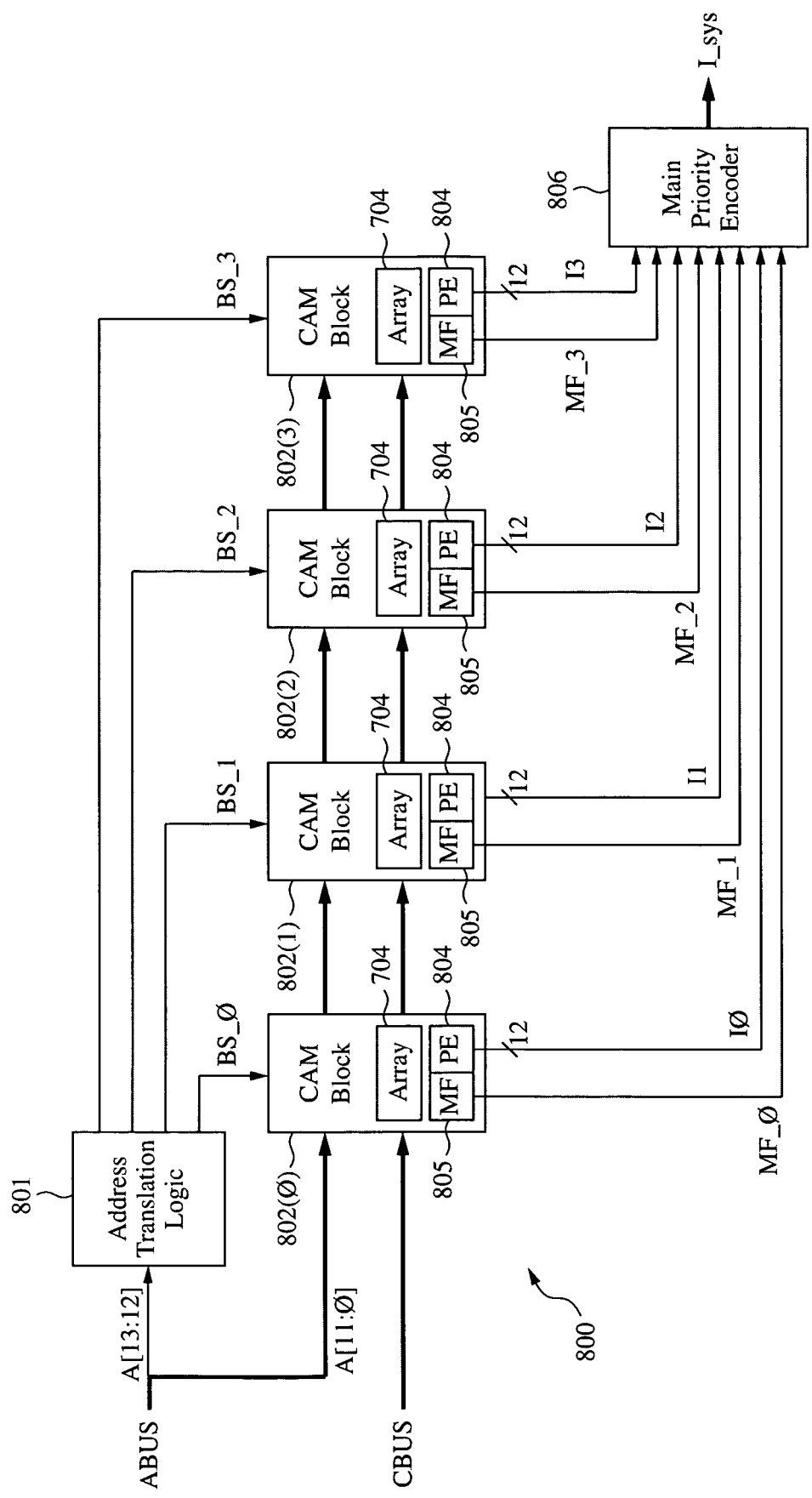
FIG. 9 is a block diagram of one embodiment of the CAM device of FIG. 7.

FIG. 9 shows a CAM device 800 that is one embodiment of the CAM device 700. CAM device 800 is shown to include address translation logic 801, four CAM blocks 802(0)-802(3), and a main priority encoder 806. Each CAM block 802 includes a CAM array 704 (e.g., a 1k CAM array), a block priority encoder 804, and match flag logic 805. Of course, in other embodiments, there may be any number of CAM blocks 802, and each CAM block array 704 may include any number of rows of CAM cells. The address A may include any suitable number of bits. In the embodiment of FIG. 9, the function of the priority encoder 708 of FIG. 7 is distributed between the individual block priority encoders 804 within the CAM blocks 802(0)-802(3) and the main priority encoder 806. During a read or write operation, a 14-bit address A[13:0] may be provided to the device 800 via the address bus ABUS. The first two address bits A[13:12] are the block address bits and are provided to address translation logic 801, which in turn selects one of the CAM blocks 802(0)-802(3) for the read or write operation via block select signals BS_0 to BS_3, respectively. The remaining twelve address bits, A[11:0], select a row in the CAM array 704 selected by address translation logic 801 for the operation, and may be provided to each CAM block 802. During read or write operations, data may be read from or written to the row identified by row address bits A[11:0] in the CAM block 802 selected by address translation logic 801.

Information indicative of which CAM blocks 802 are found to be defective during testing may be used to configure address translation logic 801 to re-address the non-defective CAM blocks 802 so as to occupy, for instance, the contiguous highest-priority address space (e.g., the lowest numbered addresses). During a read or write operation, address translation logic 801 receives block address bits A[13:12]. If a CAM block 802 selected by block address bits A[13:12] is non-defective or otherwise enabled, address translation logic 801 asserts the corresponding block select signal BS to enable the selected CAM block 802 for the operation. For example, if an address [13:0] selects the first row in the first CAM block 802(0) for reading, and CAM block 802(0) is non-defective, address translation logic 801 asserts BS_0 to logic high while maintaining BS_1, BS_2, and BS_3 in a logic low, de-asserted state. The asserted BS_0 signal causes row address bits A[11:0] to be latched into the first CAM block 802(0), thereby facilitating a read from the first CAM block 802(0).

Conversely, if a CAM block 802 selected by block address bits A[13:12] is defective or otherwise disabled, address translation logic 801 selects another CAM block for the operation by asserting its corresponding block select signal BS. For example, if the address [13:0] selects the first row in the first CAM block 802(0) for reading, and CAM block 802(0) is defective and the second CAM block 802(1) is non-defective, address translation logic 801 may assert BS_1 to logic high while maintaining BS_0, BS_2, and BS_3 in a logic low, de-asserted state. The asserted BS_1 signal causes row address bits A[11:0] to be latched into the second CAM block 802(1), thereby facilitating a read from the second CAM block 802(1). In this manner, address translation logic 801 may re-address read or write operations from defective CAM blocks to non-defective CAM blocks.

Figure 10:
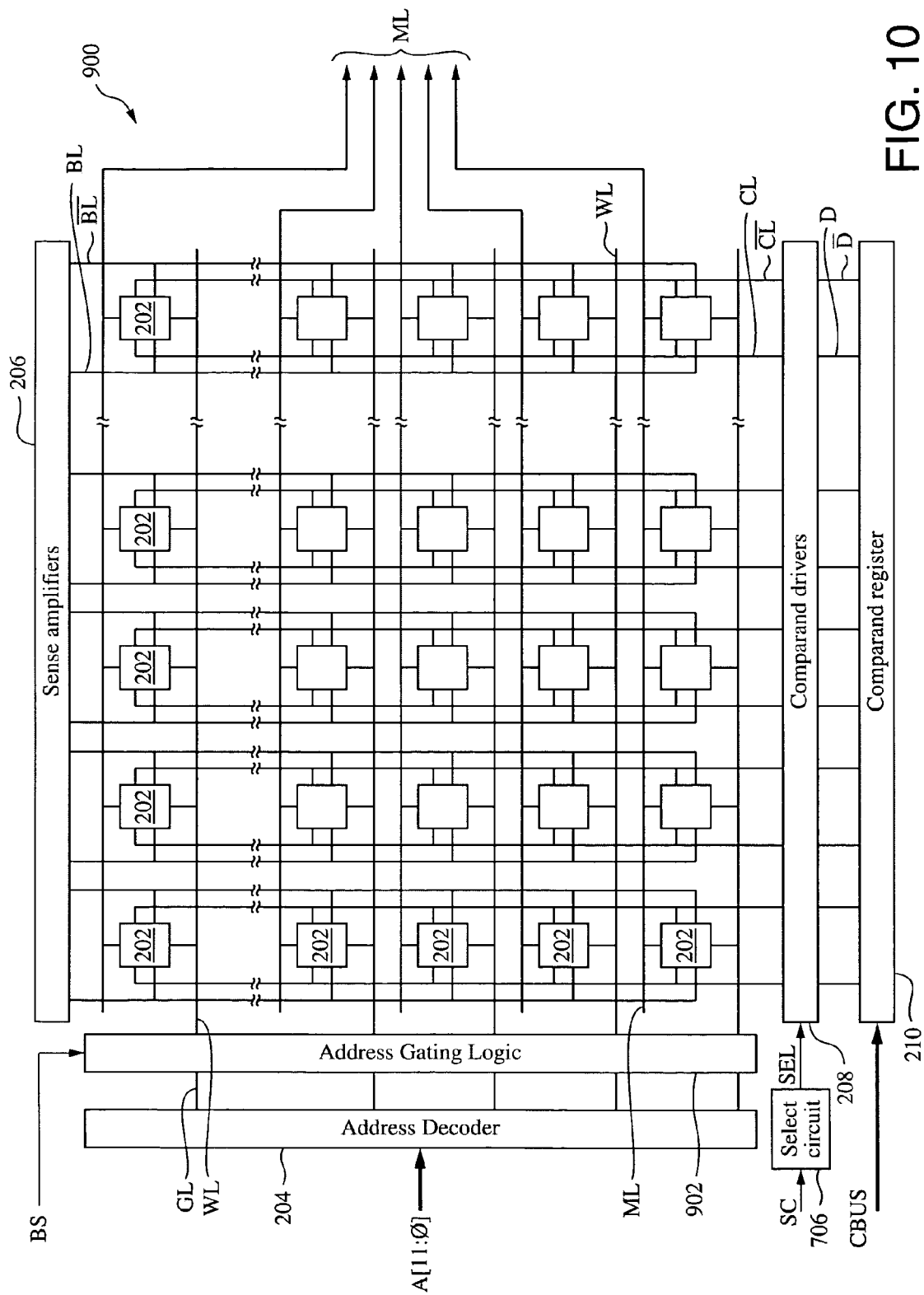
FIG. 10 is a block diagram of a CAM block in one embodiment of the device of FIG. 9.

In some embodiments, the block select signal BS provided to the CAM block 802 may be used as an address gating signal to facilitate address translation in accordance with present embodiments. For example, FIG. 10 shows a CAM array 900 that is one embodiment of the array 704 of FIG. 7. The array 900 includes a plurality of CAM cells 202 organized in any number of rows and columns, and operates in a manner similar to the CAM array 200 described above with respect to FIG. 2. That is, during compare operations, comparand data provided by the comparand register 210 is selectively driven onto the complementary comparand lines CL and $\overline{CL}$ in response to the select signal SEL provided by the block select circuit 706. If the array 900 is non-defective, the select signal SEL is asserted to logic high to allow the comparand word to be driven into the array 900 for comparison with CAM words stored therein. Conversely, if the array 900 is found to be defective during testing, the block select circuit 706 is configured to provide a de-asserted select signal SEL to the comparand drivers 208 to prevent comparand data from being driven onto the comparand lines CL and $\overline{CL}$, thereby disabling the array 900.

Address bits A[11:0] are provided from address bus ABUS to the address decoder 204. Address gating logic 902 is connected between the address decoder 204 and corresponding word lines WL of the array 900 via gated lines GL, and selectively drives a word line WL identified by A[11:0] in response to the block select signal BS. For example, during a read or write operation, address decoder 204 decodes A[11:0] to select a row of CAM cells 202 for the operation, and drives a corresponding gated line GL to logic high. If BS is asserted to logic high, address gating logic 902 drives the corresponding word line WL to select the row of CAM cells 202 for the operation. Conversely, if BS is de-asserted to logic low, address logic 902 does not drive any of the word lines WL to logic high, regardless of A[11:0], thereby preventing CAM cells 202 in the array from being addressed for the operation.

In one embodiment, address gating logic 902 may include for each word line WL in the array 900 an AND gate (not shown) having an output terminal coupled to the word line, a first input terminal coupled to the corresponding gated line GL, and a second input terminal to receive the block select signal BS. In this manner, the AND gates may be used to selectively gate the addressing of CAM cells in the block in response to BS. Of course, in other embodiments other suitable logic may be used.

Figure 11:
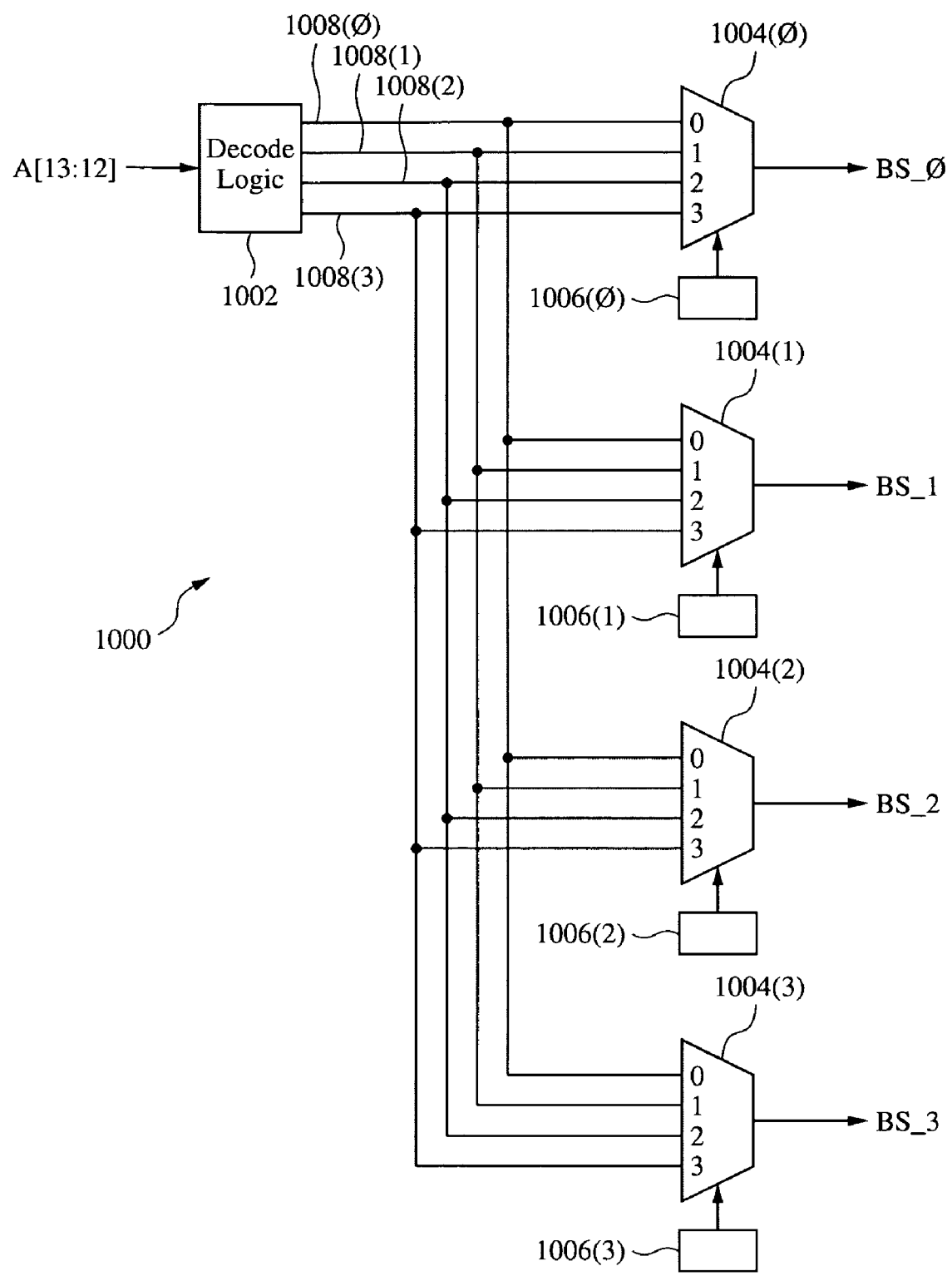
FIG. 11 is a block diagram of address translation logic in one embodiment of the CAM block of FIG. 10.

FIG. 11 shows address translation logic 1000 that is one embodiment of the address translation logic 801 of FIG. 9. Logic 1000 includes decode logic 1002, four 4-input multiplexers 1004(0)-1004(3), and four corresponding memory elements 1006(0)-1006(3), respectively. Decode logic 1002 has an input terminal to receive block address bits A[13:12], and has four output terminals coupled to corresponding input terminals of the multiplexers 1004(0)-1004(3) via lines 1008(0)-1008(3), respectively. Decode logic 1002 decodes block address bits A[13:12], and in response thereto, asserts one of output lines 1008(0)-1008(3) to logic high. For example, if address bits A[13:12] are "00", which is equivalent to the decimal value "0", decode logic asserts line 1008(0); if address bits A[13:12] are "01", which is equivalent to the decimal value "1", decode logic 1002 asserts line 1008(1); if address bits A[13:12] are "10", which is equivalent to the decimal value "2", decode logic 1002 asserts line 1008(2); and if address bits A[13:12] are "11", which is equivalent to the decimal value "3", decode logic 1002 asserts line 1008(3).

The multiplexers 1004(0)-1004(3) each include an output terminal coupled to a corresponding one of the CAM blocks 802(0)-802(3), respectively, and a control terminal coupled to a corresponding one of the memory elements 1006(0)-1006(3), respectively. Each memory element 1006 stores address translation information that when provided to the corresponding multiplexer 1004 selects one of the signals provided by decode logic 1002 to be output as the block select signal BS. In this manner, multiplexers 1004(0)-1004 (3) may dynamically assign block address values to CAM blocks 802(0)-802(3), respectively.

In accordance with present embodiments, a read or write operation to a defective CAM block may be re-addressed to a non-defective CAM block by manipulating the address translation information stored in the memory elements 1006 (0)-1006(3). In some embodiments, where all CAM blocks 802(0)-802(3) are non-defective, the memory elements 1006 (0)-1006(3) store default block address values so as to not alter CAM addressing during the read or write operation. That is, the default block address values cause respective multiplexers 1004(0)-1004(3) to select corresponding signals on lines 1008(0)-1008(3) as block select signals BS_0 to BS_3, respectively. For example, memory element 1006 (0) may store a default block address value of "0" to cause multiplexer 1004(0) to select the signal on line 1008(0) as BS_0, memory element 1006(1) may store a default block address value of "1" to cause multiplexer 1004(1) to select the signal on line 1008(1) as BS_1, memory element 1006 (2) may store a default block address value of "2" to cause multiplexer 1004(2) to select the signal on line 1008(2) as BS_2, and memory element 1006(3) may store a default block address value of "3" to cause multiplexer 1004(3) to select the signal on line 1008(3) as BS_3. In this manner, address translation logic 1000 selects for the read or write operation the CAM block identified by address bits A[13: 12]. Table 1 summarizes the four default block address/ multiplexer select values (MUX) and corresponding address space when all CAM blocks are non-defective.

TABLE 1

| Block | Status | MUX | address space |
|---|---|---|---|
| CAM 802(0) | non-defective | 0 | 0 to k-1 |
| CAM 802(1) | non-defective | 1 | k to 2k-1 |
| CAM 802(2) | non-defective | 2 | 2k to 3k-1 |
| CAM 802(3) | non-defective | 3 | 3k to 4k-1 |

The CAM device 800 is then tested to determine if any CAM blocks are defective. Where it is determined that one or more CAM blocks are defective, the select values stored in memory elements 1006(0)-1006(3) may be modified to re-address the non-defective CAM blocks. For example, if after testing it is determined that CAM block 802(0) is defective, and is thereafter disabled using the corresponding block select circuit 706 as described above (see also FIG. 7), the 1k CAM rows in the defective CAM block 802(0) are no longer available, and therefore the device 800 now has only 3k available CAM rows available, i.e., 1k rows in each of the 3 non-defective CAM blocks 802(1)-802(3). Since the first CAM block 802(0) is not available, it is desirable for the second CAM block 802(1) to be the highest-priority CAM block (e.g., having address space 0 to k-1), for the third CAM block 802(2) to be the second highest-priority CAM block (e.g., having address space k to 2k-1), and for the fourth CAM block 802(3) to be the third highest-priority CAM block (e.g., having address space 2k to 3k-1.

The block address values stored in corresponding memory elements 1006(0)-1006(3) may be modified to implement a new addressing scheme for the non-defective CAM blocks 802(1)-802(3). For example, in one embodiment, the block address value stored in the memory element 1006(1) is set to "0" so that multiplexer 1004(1) selects the signal on line 1008(0) as BS_1 to be provided to CAM block 802(1). When A[13:12] equals "00", decode logic 1002 asserts line 1008(0) to logic high, which in turn now passes through multiplexer 1006(1) to select the second CAM block 802(1) for the operation. In this manner, address translation logic 1000 translates address space 0 to k-1 from CAM block 802(0) to CAM block 802(1).

Similarly, the block address value stored in the memory element 1006(2) is set to "1" so that multiplexer 1004(2) selects the signal on line 1008(1) as BS_2 to provide to CAM block 802(2). When A[13:12] equals "01", decode logic 1002 asserts line 1008(1) to logic high, which in turn now passes through multiplexer 1004(2) to select the third CAM block 802(2) for the operation, thereby translating address space k to 2k-1 from CAM block 802(1) to CAM block 802(2). Similarly, the block address value stored in the memory element 1006(3) is set to "2" so that multiplexer 1004(3) selects the signal on line 1008(2) as BS_3 to provide to CAM block 802(3). When A[13:12] equals "10", decode logic 1002 asserts line 1008(2) to logic high, which in turn now passes through multiplexer 1004(3) to select the fourth CAM block 802(3) for the operation, thereby translating address space 2k to 3k-1 from CAM block 802(2) to CAM block 802(3). Table 2 summarizes the select values when CAM block 802(0) is defective and CAM blocks 802(1)-802(3) are non-defective.

TABLE 2

| Block | Status | MUX | address space |
|---|---|---|---|
| CAM 802(0) | defective | 3 | 3k to 4k-1* |
| CAM 802(1) | non-defective | 0 | 0 to k-1 |
| CAM 802(2) | non-defective | 1 | k to 2k-1 |
| CAM 802(3) | non-defective | 2 | 2k to 3k-1 |

*not used

By translating address space in CAM blocks 802(1)-802(3), respectively, present embodiments may re-address rows in non-defective CAM blocks 802(1)-802(3) with the highest-priority CAM addresses, e.g., row addresses 0 to 3k-1. In this manner, the three non-defective CAM blocks 802(1)-802(3) of device 800 may be sold and operated as a 3k CAM array. This is in contrast to prior art CAM devices, which are typically discarded if any of the CAM blocks therein are found to be defective. The ability to re-address the defective CAM block 802(0) and use the non-defective CAM blocks 802(1)-802(3) of device 800 as a 3k CAM array, rather than discarding the device 800, may significantly increase manufacturing yield.

In the example above, address space in the defective CAM block 802(0) is translated from row assignments 0 to k-1 to row assignments 3k to 4k-1 by changing the select value stored in the memory element 1006(0) from "0" to "3". This ensures that the defective CAM block 802(0) will not be addressed during read or write operations. That is, since the 3 non-defective CAM blocks are used as a 3k CAM array having address space 0 to 3k-1, address space higher than 3k-1 is not used, and therefore the defective CAM block 802(0) will not be addressed. For an alternate embodiment, the block select signal BS_0 can be set to a low logic state to disable block 802(0). For one example, the output of each MUX can be coupled to a logic circuit (e.g., one or more AND, OR, XOR, NOT circuits) and memory 1006 configured to disable BS and its corresponding block when a particular value is programmed into memory 1006 (or the value is changed in memory 1006).

In other embodiments, the block address values stored in memory elements 1006(0)-1006(3) may be modified to translate address space in any number n of non-defective CAM blocks into a contiguous address space of 0 to (k)n-1, irrespective of whether the non-defective CAM blocks are adjacent to one another. Thus, for example, if in one embodiment the CAM blocks 802(0) and 802(2) are defective and CAM blocks 802(1) and 802(3) are non-defective, the non-defective CAM blocks 802(1) and 802(3) may be configured for operation as a 2k CAM array by setting the block address values for memory elements 1006(1) and 1006(3) to "0" and "1", respectively. In this manner, the first 1k address space corresponding A[13:12] equal to "00" selects CAM block 802(1), and the second 1k address space corresponding to A[13:12] equal to "01" selects CAM block 802(3). The block address values stored in memory elements 1006(0) and 1006(2) each may be either "2" or "3" to preclude their selection during operation, since addresses above 2k-1, i.e., the third or fourth 1k address spaces corresponding to A[13:12] equal to "10" or "11", respectively, are not used. Table 3 summarizes the block address values and corresponding address space when CAM blocks 802(0) and 802(2) are defective and CAM blocks 802(1) and 802(3) are non-defective.

TABLE 3

| Block | Status | MUX | address space |
|---|---|---|---|
| CAM 802(0) | defective | 2 or 3 | >2k* |
| CAM 802(1) | non-defective | 0 | 0 to k-1 |
| CAM 802(2) | defective | 2 or 3 | >2k* |
| CAM 802(3) | non-defective | 1 | k to 2k-1 |

*not used

Each memory element 1006 may be any suitable structure to provide a block address value to the corresponding multiplexer 1004 to select one of lines 1008(0)-1008(3) to pass as the block select signal BS. In some embodiments, the memory element may be a flip-flop, register, look-up table, or non-volatile memory such EPROM or Flash memory. In other embodiments, the memory element 1006 may include one or more fuses to provide the block address value to the corresponding multiplexer 1004.

For one example, in one embodiment of the CAM device 800, each memory element 1006 includes two fuses coupled to a voltage supply to initially provide the binary value "11" to corresponding multiplexers 1004. In this example, since each multiplexer 1004 initially selects the signal line connected to its "3" input in response to the binary block address value "11", the "3" input of each multiplexer 1004 is connected to a corresponding numbered signal line 1008 from decode logic 1002. That is, input number 3 of multiplexer 1004(0) is connected to the line 1008(0), input number 3 of multiplexer 1004(1) is connected to the line 1008(1), input number 3 of multiplexer 1004(2) is connected to the line 1008(2), and input number 3 of multiplexer 1004(3) is connected to the line 1008(3). The remaining multiplexer inputs 0, 1, and 2 may be connected to lines 1008 in any suitable configuration. In this manner, multiplexer 1004(0) asserts BS_0 when A[13:12] equals "00", multiplexer 1004(1) asserts BS_1 when A[13:12] equals "01", multiplexer 1004(2) asserts BS_2 when A[13:12] equals "10", and multiplexer 1004(3) asserts BS_3 when A[13:12] equals "11". Then, if after testing one or more of the CAM blocks 802 are found to be defective, the fuses of each memory element 1008 may be selectively blown to translate address space from defective CAM blocks to non-defective CAM blocks 802 to facilitate contiguous addressing in the manner described above. Additionally, the two logic ones may be ANDed together and provided as one input to an AND gate, and the other input to the AND gate coupled to a respective BS signal output by each MUX. When a defective row is programmed to a value other than "11", then the respective BS signal and corresponding block will be disabled.

In order to maintain address consistency between read or write operations and compare operations when address space in a defective CAM block is translated to a non-defective CAM block, address translation information used during the read or write operation is also used to calculate the address or index of a matching CAM row during compare operations. Thus, for example, if address space 0 to k-1 is translated from CAM block 802(0) to 802(1), and there is a match in CAM block 802(1) during a subsequent compare operation, the priority encoder 806 ensures that the matching index from CAM block 802(1) lies within address space 0 to k-1, rather than within address space k to 2k-1. In this manner, address translations facilitated during a read or write operation are reflected during subsequent compare operations.

Referring again to FIG. 9, during compare operations, a comparand word provided on CBUS is compared to data stored in all enabled (e.g., non-defective) CAM blocks 802. For each enabled CAM block 802, if there is a match condition in response to the compare operation, match flag logic 805 asserts a match flag (MF_0 to MF_3) to a logic high state, and the priority encoder 804 within the CAM block 802 outputs the 12-bit row index I (or address) of the highest priority matching CAM row in the block. If there is not a match, the match flags are not asserted (i.e., match flag logic 805 sets MF to low logic state). For one embodiment, each match flag logic includes a programmable element (e.g., a fuse or other memory element) that is programmed when the CAM block is disabled. The match flags MF_0 to MF_3 and row indexes 10-13 from CAM blocks 802(0)-802(3), respectively, are provided to the main priority encoder 806. The main priority encoder 806 adds a unique block index to each row index I provided by CAM blocks 802(0)-802(3) to form a corresponding device index. The main priority encoder 806 uses the match flag signals MF_0 to MF_3 to select the highest-priority device index from CAM blocks 802(0)-802(3) to output as the system index, I_sys.

The main priority encoder 806 is programmable and stores the block indexes for CAM blocks 802(0)-802(3) in memory (not shown in FIG. 9). The block indexes are dynamic values that may be modified or programmed to reflect and thus maintain consistency with address translations as described above in a read or write operation. Initially, the main priority encoder stores a block index of "00" for CAM block 802(0), a block index of "01" for CAM block 802(1), a block index of "10" for CAM block 802(2), and a block index of "11" for CAM block 802(3). These initial block indexes, which are used when all CAM blocks 802(0)-802(3) are enabled, mirror the block address values stored in memory elements 1006(0)-1006(3) of address translation logic 1000 of FIG. 11. If one or more CAM blocks 802 are found to be defective or are otherwise disabled, the block indexes stored in main priority encoder 806 are modified to reflect address translations during the read or write operation. For example, if CAM blocks 802(0) and 802(2) are disabled and address spaces in non-defective CAM blocks 802(1) and 802(3) are translated to address space 0 to k-1 and address space k to 2k-1, respectively, main priority encoder 806 adds a block index of "00" to row index 11 to generate the device index for CAM block 802(1) and adds a block index "01" to row index 13 to generate the device index for CAM block 802(3). In this manner, address consistency between read/write operations and compare operations is maintained.

Figure 12:
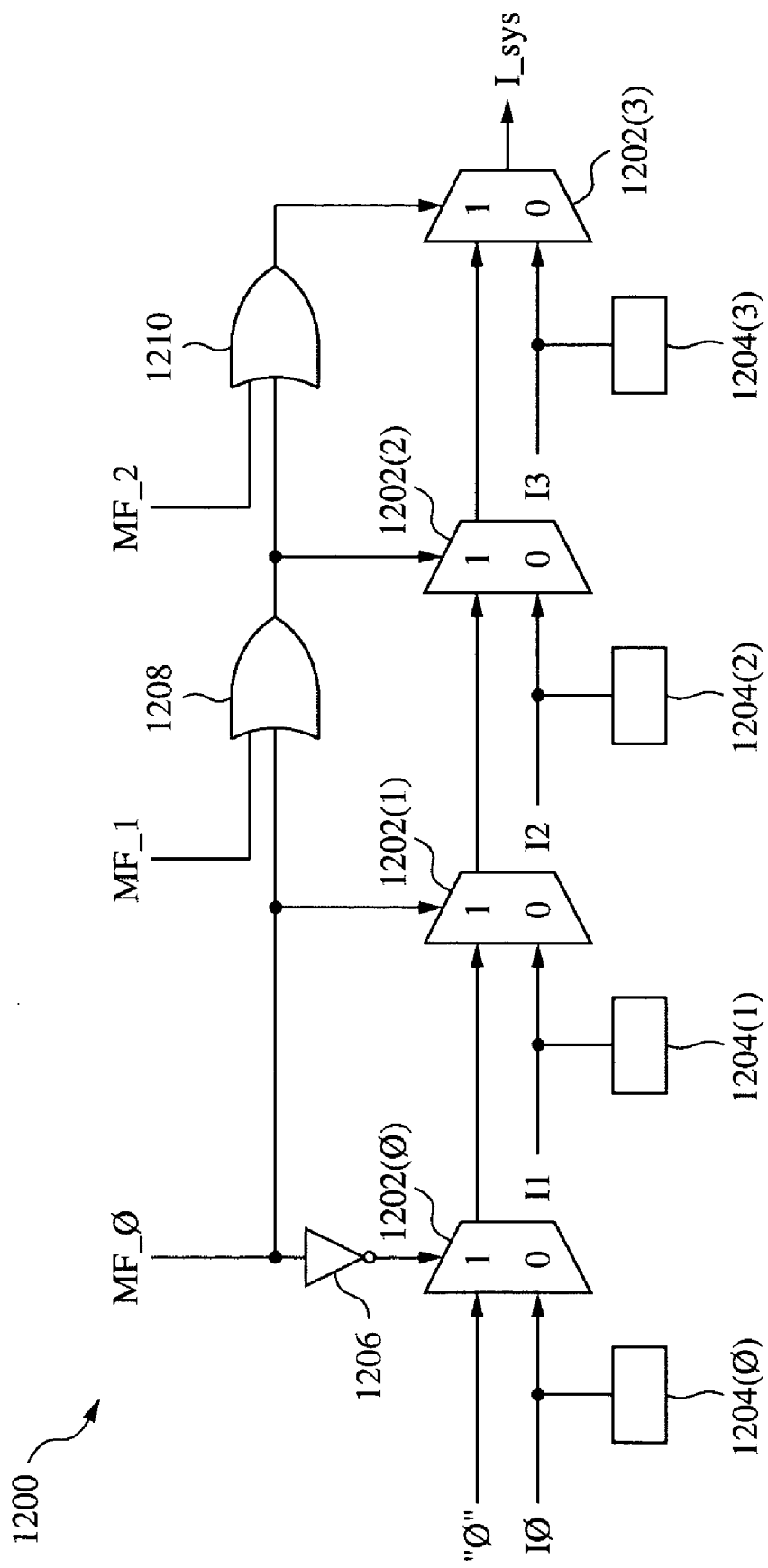
FIG. 12 is a logic diagram of a main priority encoder in one embodiment of the device of FIG. 9.

FIG. 12 shows a priority encoder 1200 that is one embodiment of the main priority encoder 806 of FIG. 9. The priority encoder 1200 includes a chain of four multiplexers 1202(0)-1202(3), four corresponding memory elements 1204(0)-1204(3), and select logic including an inverter 1206 and OR gates 1208 and 1210. Each memory element 1204 stores a 2-bit block index for a corresponding CAM block 802. The memory elements 1204 may be the same as memory elements 1006 of FIG. 11, or they may be separate memory elements. Each multiplexer 1202 includes a first input (i.e., the "1" input) coupled to the output of a preceding multiplexer 1202 in the chain, a second input (i.e., the "0" input) to receive a concatenation of a 12-bit index I of the highest priority match (if any) from a corresponding CAM block 802 and a 2-bit block index from the corresponding memory element 1204, an output coupled to input "1" of a next multiplexer 1202, and a select terminal to receive match information from the CAM blocks 802.

The concatenation of a 12-bit row index I and the 2-bit block index forms a 14-bit device index of the highest-priority match, if any, from a corresponding CAM block 802. The 1 input of the first multiplexer 1202(0) receive a default binary "0" value. MF_0 is inverted by inverter 1206 and provided as the select signal to multiplexer 1202(0), and provided directly as the select signal to multiplexer 1202(1). MF_0 and MF_1 are combined in OR gate 1208 and provided as the select signal for multiplexer 1202(2). MF_2 and the result from OR gate 1208 (i.e., MF_0+MF_1, where + is the logic OR function) are combined in OR gate 1210 and provided as the select signal for multiplexer 1202(3). As explained below, the match flags MF control whether each multiplexer 1202 passes a concatenated device index from a previous CAM block or the concatenated device index of the corresponding CAM block.

In this example, CAM block 802(0) is the highest-priority block, CAM block 802(1) is the next highest-priority block, and so on. For each multiplexer stage, if there is a match in the corresponding CAM block 802, the row index I and block index are forwarded to the next stage if there is not a match condition in a previous or higher-priority CAM block 802. If there is a match condition in a higher-priority CAM block 802, the row index I plus block index from the higher-priority CAM block are forwarded to the next stage.

For example, if there is a match condition in the first CAM block 802(0), priority encoder 804 of CAM block 802(0) provides the 12-bit row index 10 of its highest-priority match to input 0 of multiplexer 1202(0), where it is concatenated with the block index from memory element 1204(0) to generate the device index for CAM block 802(0). The match flag MF_0 is asserted to logic high to indicate the match condition. In response thereto, inverter 106 provides a logic low or "0" select signal to multiplexer 1202(0), which in turn forwards the device index from CAM block 802(0) to the next multiplexer 1204(1). The logic high MF_0 signal causes multiplexer 1204(1) to select input 1, and thus forwards the device index from CAM block 802(0) to the next multiplexer 1202(2). MF_0 ripples through OR gates 1208 and 1210 and causes multiplexers 1202(2) and 1202(3) to output the device index from CAM block 802(0) as I_sys.

Maintaining equivalent values in corresponding memory elements 1006(0)-1006(3) and 1204(0)-1204(3) ensures addressing consistency between read or write operations and compare operations. For instance, in one embodiment where all CAM blocks 802(0)-802(3) are non-defective or otherwise enabled, memory elements 1204(0)-1204(3) store values of "00", "01", "10" and "11", respectively. In this manner, "00" is added to row index I0 so that the first 1k addresses are mapped to the first block 802(0), "01" is added to row index I1 so that the second 1k addresses are mapped to the second block 802(1), "10" is added to row index I2 so that the third 1k addresses are mapped to the third block 802(2), and "11" is added to row index I3 from block 802(3) so that the fourth 1k addresses are mapped to the fourth block 802(3).

The block indexes stored in memory elements 1204(0)-1204(3) may be changed when address space in one or more CAM blocks 802 is translated to maintain addressing consistency. For example, in one embodiment where CAM block 802(0) is defective, CAM blocks 802(1)-802(3) may be configured to operate as a 3k CAM array as described above with respect to address translation logic 1000 (FIG. 11) by setting block address values or their binary equivalents of "0", "1" and "2" into memory elements 1006(1), 1006(2), and 1006(3), respectively. This configures CAM block 802(1) to have the highest-priority address space, i.e., addresses 0 to k-1, CAM block 802(2) to have the next highest-priority address space, i.e., k to 2k-1, and CAM block 802(3) to have the lowest-priority address space, i.e., addresses 2k to 2k-1.

In accordance with present embodiments, the block indexes stored in memory elements 1204(0)-1204(3) are modified to reflect address translations facilitated in address translation logic 1000. Since CAM block 802(0) is disabled (and thus does not require address space), the block indexes of the remaining enabled CAM blocks 802(1)-802(3) may be modified to re-assign block priority in the CAM device 800. For example, the block index stored in memory element 1204(1) may be set to "00" so that when concatenated with row index I1 from the highest-priority CAM block 802(1), the resultant device index corresponds to the highest-priority address space, i.e., addresses 0 to k-1. Similarly, the block indexes stored in memory elements 1204(2) and 1204(3) may be modified to "01" and "10", respectively, to reflect address spaces k to 2k-1 and 2k to 3k-1, respectively. Since in this embodiment addresses larger than 3k are not used, the block index stored in memory element 1204(0), which corresponds to the defective CAM block 802(0), may be set to "11" so that disabled CAM block 802(0) is not addressed. Note that the match flag signal for a disabled CAM block will be set to a low logic state.

What is claimed is:

1. A content addressable memory (CAM) device comprising:
    a plurality of CAM blocks, each including an array of CAM cells; and
    a plurality of block select circuits, each having an output coupled to a corresponding CAM block and having an input to receive a select signal that indicates whether the corresponding CAM block is defective, wherein each block select circuit disables the corresponding CAM block if the CAM block is defective; and
    a priority encoder having a plurality of inputs each coupled to a corresponding CAM block, and having an output to generate an index of a highest priority match in CAM blocks.

2. The CAM device of claim 1, wherein each block select circuit further comprises a memory element for storing the select signal.

3. The CAM device of claim 1, wherein each CAM block further comprises:
    a number of comparand drivers, each having a data input to receive a bit of a comparand word, a control input to receive the select signal, and an output coupled to a corresponding column of the array of CAM cells.

4. The CAM device of claim 1, wherein each block select circuit selectively disables the corresponding CAM block in response to the corresponding select signal.

5. The CAM device of claim 1, wherein each block select circuit provides a select signal to the corresponding CAM block, the select signal indicating whether the corresponding CAM block is defective.

6. The CAM device of claim 5, wherein each block select circuit disables the corresponding CAM block if the select signal is in a first state and enables the corresponding CAM block if the select signal is in a second state.

7. A content addressable memory (CAM) device comprising:
    a first CAM block having an array of CAM cells organized in a number of rows and columns;
    a second CAM block having an array of CAM cells organized in a number of rows and columns;
    a priority encoder having inputs coupled to the first and second CAM blocks, and having an output to generate an index of a highest priority match in the CAM blocks; and
    means for enabling comparand data for comparison with data stored in the first CAM block if the first CAM block is non-defective and for disabling the comparand data for comparison with data stored in the second CAM block if the second CAM block is defective.

8. A method of operating a content addressable memory (CAM) device having a plurality of CAM blocks each including an array of CAM cells, comprising:
    determining whether each CAM block is defective; and
    selectively disabling the CAM blocks from participatinq in a compare operation between comparand data and data stored in the CAM blocks in response to the determining, wherein the selectively disabling comprises, for each CAM block:
    allowing comparand data to be driven into the CAM block during compare operations if a select signal is in a first state; and
    preventing the comparand data from being driven into the CAM block during compare operations if the select signal is in a second state.

9. The method of claim 8, wherein the determining comprises, for each CAM block:
   generating the select signal indicating whether the CAM block is defective; and
   forwarding the select signal to the corresponding CAM block.

10. The method of claim 9, further comprising, for each CAM block:
    storing the select signal in a memory.

11. A method of operating a content addressable memory (CAM) device having a plurality of CAM blocks each including an array of CAM cells, comprising:
    providing a select signal to each CAM block; and
    selectively allowing comparand data to be driven into the CAM blocks during compare operations between data stored in the CAM blocks and the comparand data in response to the select signals, wherein the selectively allowing comprises, for each CAM block:
    enabling the comparand data to be driven into the CAM block if the select signal is in a first state; and
    disabling the comparand data from being driven into the CAM block if the select signal is in a second state.

12. The method of claim 11, wherein the select signals indicate whether corresponding CAM blocks are defective.

13. The method of claim 11, further comprising:
    storing each select signal in a memory location associated with the corresponding CAM block.

14. A method of operating a content addressable memory (CAM) device having a plurality of CAM blocks each including an array of CAM cells, comprising:
    selectively enabling a first CAM block to compare comparand data with data stored in the first CAM block in response to a first block select signal; and
    selectively disabling a second CAM block from comparing the comparand data with data stored in the second CAM block in response to a second block select signal wherein the first block select signal indicates that the first CAM block is non-defective, and the second block select signal indicates that the second CAM block is defective.

\* \* \* \* \*

UNITED STATES PATENT AND TRADEMARK OFFICE
CERTIFICATE OF CORRECTION

PATENT NO.       : 7,325,091 B2
APPLICATION NO.  : 10/855580
DATED            : January 29, 2008
INVENTOR(S)      : Jose Pio Pereira It is certified that error appears in the above-identified patent and that said Letters Patent is hereby corrected as shown below:

Claim 1, Column 18, Line 5
    Replace "CAM cells; and"
       with --CAM cells;--

Claim 8, Column 18, Line 57
    Replace "blocks from participatinq"
       with --blocks from participating--

Signed and Sealed this

Sixth Day of May, 2008

JON W. DUDAS
*Director of the United States Patent and Trademark Office*